United States Patent [19]

DoMinh

[11] Patent Number: 4,968,586
[45] Date of Patent: Nov. 6, 1990

[54] PHOTORESIST COMPOSITIONS CONTAINING COBALT (III) COMPOUND AND REDOX TRANSFER LIGAND

[75] Inventor: Thap DoMinh, Fort Collins, Colo.

[73] Assignee: Eastman Kodak Company, Rochester, N.Y.

[21] Appl. No.: 453,234

[22] Filed: Dec. 14, 1989

Related U.S. Application Data

[63] Continuation-in-part of Ser. No. 289,643, Dec. 23, 1988, abandoned.

[51] Int. Cl.$^5$ .............................................. G03C 1/67
[52] U.S. Cl. ................................. 430/325; 430/277; 430/311; 430/330; 430/341; 430/179; 430/170; 430/936; 430/915
[58] Field of Search .............. 430/936, 341, 536, 170, 430/277, 311, 330, 179, 177, 325, 915, 151, 154

[56] References Cited

U.S. PATENT DOCUMENTS

| | | | |
|---|---|---|---|
| 4,075,019 | 2/1978 | DoMinh | 96/88 |
| 4,247,675 | 1/1981 | Fletcher et al. | 430/936 |

Primary Examiner—Paul R. Michl
Assistant Examiner—Thorl Chea
Attorney, Agent, or Firm—William J. Davis

[57] ABSTRACT

A negative-working imaging composition suitable for use as a dry film resist, comprises, in admixture, (a) a polymeric binder, (b) a Co (III) compound capable of partial reduction to Co (II) upon exposure to activating radiation, and (c) a redox transfer ligand capable of reacting with Co (II) to form a Co (II) chelate which reduces adjacent remaining Co (III) compound and forms a Co (III) chelate effective to provide imagewise differential solubility to the composition. The composition can be imagewise exposed to activating radiation, such as a laser, heated, and developed with a developer to form a resist image in the exposed areas. An element comprising a support and a layer of the above-described composition is particularly useful in the manufacture of printed circuit boards by laser direct imaging.

13 Claims, No Drawings

PHOTORESIST COMPOSITIONS CONTAINING COBALT (III) COMPOUND AND REDOX TRANSFER LIGAND

This is a continuation-in-part of application Ser. No. 289,643 filed Dec. 23, 1988 now abandoned.

FIELD OF THE INVENTION

This invention relates to negative-working imaging compositions suitable for exposure to activating radiation, such as a laser, to form a resist image.

BACKGROUND OF THE INVENTION

Laser direct imaging for the printed circuit board industry is an emerging manufacturing technology which promises fast turn-around, high yield and the precision required for future generations of high density, fine line printed circuit boards. The need to mass-produce microscopically dimensioned, etched configurations has resulted in demand for resists with the properties of greater speed and improved image resolution and processing integrity to reduce the unit cost of the end-product board. "Speed" as used herein refers to the sensitivity of the composition to activating radiation and is not to be confused with development rates.

Photoresists have been developed for laser direct imaging based on the mechanism of light-induced imagewise hardening of a polymer coating. However, light-induced hardening of a polymer coating generally is a low speed process. Furthermore, the hardening mechanism is usually based on the photopolymerization of a monomer system which is subject to swelling in the development process. Consequently, the final resist image tends to exhibit poor resolution and integrity.

Thus, the problem solved by this invention is to provide a negative-working photoresist composition, suitable for laser exposure direct imaging, that is capable of higher speed than prior art resist compositions and which exhibits improved image resolution and processing integrity.

SUMMARY OF THE INVENTION

I have discovered novel negative-working photoresist compositions featuring a polymeric binder, a cobalt (III) compound and a redox transfer ligand.

More specifically, in accordance with this invention, there is provided a negative-working photoresist composition comprising a polymeric binder, a Co (III) compound capable of partial reduction to Co (II) upon exposure to activating radiation and a redox transfer ligand capable of reacting with Co (II) to form a Co (II) chelate which reduces adjacent remaining Co (III) compound and forms a Co (III) chelate effective to provide imagewise differential solubility to the composition. In a preferred embodiment of the invention, the resist composition further includes a sensitizer. In the presence of the sensitizer, the Co (III) compound has enhanced capability for partial reduction to Co (II) upon exposure to activating radiation.

In another embodiment of the invention, there is provided a photoresist element comprising a support and the above-described photoresist composition.

In a further embodiment of the invention, there is provided a method of producing a negative-working image in a photoresist comprising the steps of imagewise exposing to activating radiation the above-described photoresist composition, heating, followed by developing the exposed composition with a developer so that only the exposed portions remain.

The resist compositions of this invention, upon imagewise exposure to activating radiation and heating, undergo imagewise insolubilization which permits development in an aqueous alkaline developer. Photoinsolubilization occurs in an amplification reaction. Consequently, these resists exhibit higher speed than prior art compositions. The resists of this invention advantageously exhibit excellent image resolution and processing integrity, i.e., they provide tough, flexible and non-brittle coatings and resist images. Further, these resists are essentially free of tackiness and oxygen sensitivity and thus do not require a protective cover sheet. Further still, the resists of this invention can be exposed to a variety of laser exposure sources and can provide high density visible images which facilitate handling and inspection. Additionally, these resists, following the heat cure step, can be handled under white light conditions. Furthermore, they are free of monomers which can leach out during processing or volatilize during curing and cause unacceptable shrinkage or curl.

Other advantageous features of this invention will become apparent upon reference to the following Description of the Preferred Embodiments.

DETAILED DESCRIPTION OF PREFERRED EMBODIMENTS

This invention is based partly on the unexpected discovery that an ionic reaction product of Co (II) and a redox transfer ligand forms an ionic Co (III) chelate complex which is insoluble in aqueous alkaline developers and functions as a dissolution inhibitor in combination with polymeric binders to form superior negative-working photoresist compositions. While the invention is described herein primarily in connection with its preferred utility, namely as a laser direct imaging photoresist composition, it is also useful in many other applications where negative-working resists and dry film resists find utility, including printing plate products.

My U.S. Pat. No. 4,075,019 discloses an image-forming element comprising a support and a coating thereon containing a cobalt (III) complex and a compound capable of forming at least a bidentate chelate with cobalt (III). My patent in column 38 teaches that image-forming layer reactants can be dispersed in a polymer binder. However, this patent does not disclose or suggest that Co (III) chelates are effective to impart imagewise differential solubility to compositions containing a polymeric binder and thus does not teach or suggest the negative-working photoresist compositions of this invention. U.S. Pat. No. 4,410,623 issued Oct. 18, 1983 to myself and M. H. Stern discloses adducts of phthalaldehyde and imaging compositions that rely upon a source of phthalaldehydes to produce a dye when heated in the presence of amines. The imaging composition optionally includes a binder such as, for example, certain polysulfonamides having pendant sulfonamide groups as taught in columns 14 and 15. When phthalaldehyde is imagewise released from the adduct by heating, such binder crosslinks by reason of the reactivity between each $SO_2NH$ group of different polymer chains, resulting in a crosslinked polymer less soluble then the uncrosslinked binder. However, this patent does not disclose or suggest that Co (III) chelates are effective to impart imagewise differential solubility to compositions containing a polymeric binder and thus does not teach or suggest the negative-working photoresist compositions of this invention.

As stated above, the resist composition of this invention includes a Co (III) compound capable of reduction to Co (II) upon exposure to activating radiation. Such Co (III) compounds contain a molecule having a cobalt atom or ion surrounded by a group of atoms or other molecules which are generically referred to as ligands. The cobalt atom or ion in the center of these compounds is a Lewis acid while the ligands are Lewis bases. Most preferably, the Co (III) compounds employed in the practice of this invention are those having a coordination number of 6. Useful cobalt (III) compounds include those cobalt (III) complexes described in columns 4–6 in U.S. Pat. No. 4,075,019.

The following is a partial list of preferred cobalt (III) compounds:

| | |
|---|---|
| C-1 | tris(ethylenediamine) cobalt (III) trifluoromethanesulfonate |
| C-2 | tris(propylenediamine) cobalt (III) trifluoromethanesulfonate |
| C-3 | tris(propylenediamine) cobalt (III) trifluoroacetate |
| C-4 | hexamine cobalt (III) trifluoroacetate |
| C-5 | hexamine cobalt (III) trifluoromethanesulfonate |
| C-6 | tris(ethylenediamine) cobalt (III) trifluoroacetate |
| C-7 | hexamine cobalt (III) benzilate |
| C-8 | hexamine cobalt (III) perfluorobenzoate |
| C-9 | hexamine cobalt (III) thiocyanate |
| C-10 | hexamine cobalt (III) trifluoromethane sulfonate |
| C-11 | hexamine cobalt (III) heptafluorobutyrate |
| C-12 | chloropentamine cobalt (III) perchlorate |
| C-13 | bromopentamine cobalt (III) perchlorate |
| C-14 | aquopentamine cobalt (III) perchlorate |
| C-15 | bis(methylamine) tetramine cobalt (III) hexa fluorophosphate |

Exemplary highly preferred cobalt (III) compounds which have been found to be useful in the practice of this invention include compounds C-1 to C-6 set forth above.

Another essential feature of the resist composition of this invention is a redox transfer ligand which is capable of reacting with Co (II) to form a Co (II) chelate. Useful redox transfer ligands include those cobalt chelating compounds described in columns 6–9 in U.S. Pat. No. 4,075,019. Useful redox transfer ligands can be selected from such classes as nitroso-arols, dithiooxamides, formazans, aromatic azo compounds, hydrazones and Schiff bases. Additionally, the phthalaldehyde adducts described in U.S. Pat. No. 4,410,623 to Stern and Do-Minh are also effective redox transfer ligands useful in the practice of this invention.

Exemplary preferred redox transfer ligands which have been found to be useful in the practice of this invention include the following:

| | |
|---|---|
| RTL-1 | 2,2'-Bipyridine (BP) |
| RTL-2 | 1-Nitroso-2-naphthol (1-NN) |
| RTL-3 | 2-Nitroso-1-naphthol (2-NN) |
| RTL-4 | 2-(2-Thiazolylazo)-p-cresol (TAC) |
| RTL-5 | 1-(2-Pyridyl)-3-phenyl-5-(p-chlorophenyl) formazan (PPCF) |
| RTL-6 | 1-(2-Pyridylazo)-2-naphthol (PAN) |
| RTL-7 | 1-(2-Benzothiazolylazo)-2-naphthol (BAN) |
| RTL-8 | 1-Hydroxy-3-trichloroacetamidophthalan (TAPA) |
| RTL-9 | 1,3-Dihydroxy-N-(4-toluenesulfonyl)-isoindoline (TSAPA) |

The photoresist composition of this invention includes a polymeric binder. The polymer must be film-forming and compatible with the amplification chemistry. Further, the polymer must have good thermal and mechanical properties for proper transfer and exhibit a suitable pKa value and dissolution rate for proper development. Common resist polymers such as novolaks and acrylates in combination with the above-described Co (III) compounds and redox transfer ligands have failed to provide effective resist compositions. Other known resist polymers such as a polyurethane, a polyanhydride and a polyvinylacetophenone have also failed to provide effective resist compositions in accordance with this invention.

Polymers which have been found to be effective binders for use herein include the polysulfonamides. Polysulfonamides having the sulfonamide group in the polymer backbone have been found to be effective. Polysulfonamides having sulfonamide groups pendant to the polymer backbone have also been found to be effective. Preferred for use herein are the polysulfonamides described in

| | |
|---|---|
| Luders et al | U.S. Pat. No. 3,725,356, |
| Fletcher et al | U.S. Pat. No. 4,107,155, and |
| Fletcher et al | U.S. Pat. No. 4,247,625. |

The polysulfonamide preferably is selected from polymers, either homopolymers or copolymers, having recurring units with a structure selected from the following formulas (I) through (III)

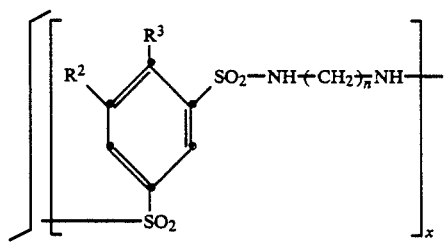

(I) 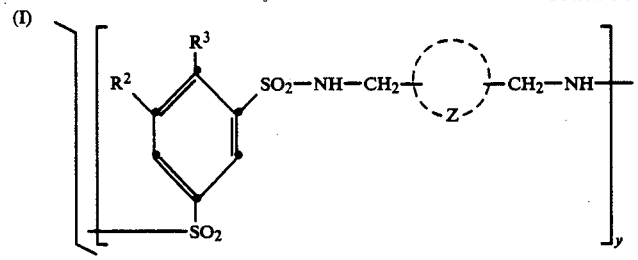

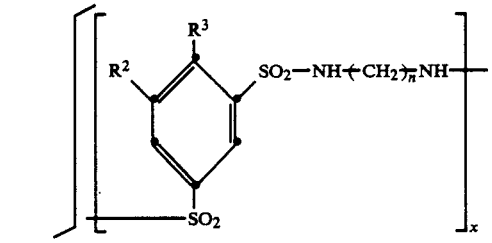

(II) 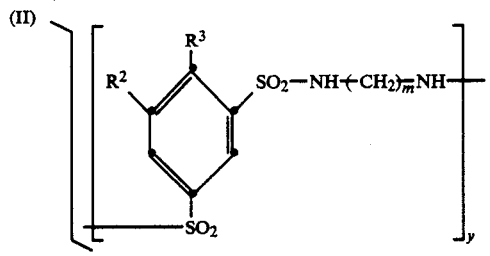

and (III) 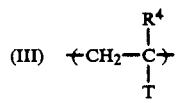

wherein $R^2$ and $R^3$ are the same or different, and are hydrogen, halogen such as chlorine, bromine and the like; or alkyl from 1 to 4 carbon atoms, for example methyl, ethyl, and the like;

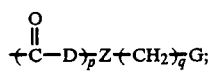

D is —O— or —NH—;

Z' is a covalent bond between carbon and D, or is the moiety

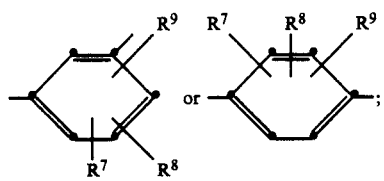

G is either —NR¹—SO₂R⁵ or —SO₂—NR¹R⁶;
$R^1$ is hydrogen;
$R^4$ is hydrogen or alkyl containing from 1 to 4 carbon atoms, such as methyl, ethyl, propyl, isopropyl and the like; $R^5$ and $R^6$ are each alkyl containing from 1 to 4 carbon atoms, such as methyl, ethyl, propyl, isopropyl and the like; aralkyl such as benzyl and the like, or aryl or substituted aryl containing from 6 to 10 carbon ring atoms, such as phenyl, naphthyl, methylphenyl, ethylphenyl, trimethylphenyl, methylnaphthyl, and the like;

$R^7$, $R^8$ and $R^9$ are the same or different and are each hydrogen; alkyl containing from 1 to 3 carbon atoms, for example, methyl, ethyl, propyl, isopropyl, and the like; or G as defined above;

n and m are different and are each an integer of from 2 through 12; p is 0 or 1; q is 0, 1, 2 or 3 except that it is 0 or 1 if Z' is phenylene;

x, x', y and y' are mole percentage amounts of the respective recurring units, x ranging from 0 to about 90%, y being at least about 10%, and x' and y' being from 0 to 100%;

and Z represents the atoms necessary to form a saturated or unsaturated carbocyclic ring having from 5 to 7 carbon ring atoms, for example, cyclohexamethylene, cycloheptamethylene, phenylene and the like.

Non-interfering repeating units other than those mentioned can be included in the copolymers useful in the invention.

Highly advantageous representative examples of polymers useful in the practice of this invention include:
poly(hexamethylene-2,4-toluenedisulfonamide) [A6];
poly(1,4-cyclohexylenedimethylene-2,4-toluenedisulfonamide) [ACy];
poly(1,3-xylylene-2,4-toluenedisulfonamide) [AXy];
poly(ethylene-co-1,4-cyclohexylenedimethylene-2,4-toluenedisulfonamide) [A2Cy];

poly(ethylene-co-hexamethylene-1-chloro-2,4-benzenedisulfonamide) [C26];
poly(ethylene-co-1,3-xylylene-1,6-dichloro-2,4-benzenedisulfonamide) [D2Xy];
poly(4-methanesulfonamidophenyl acrylate) [JW100];
poly(ethylene-co-1,4-cyclohexylenedimethylene-1,2-dichloro-3.5-benzenedisulfonamide);
poly(ethylene-co-1,4-cyclohexylenedimethylene-1-chloro-3.5-benzenedisulfonamide); and
poly(ethylene-co-hexamethylene-1-methyl-2,4-benzenedisulfonamide.

A6 (IV=0.60, 0.81, 1.18 and 1.20), A2Cy and JW100 have been found to be particularly useful in the practice of this invention and are most preferred.

The above-described polysulfonamides can be prepared by known techniques, such as those described in U.S. Pat. Nos. 3,725,356; 4,107,155 and 4,247,625. For example, polysulfonamides having a linear sulfonamide backbone can be prepared by polycondensing in solution the appropriate diamines and aromatic disulfonyl chloride, or by any other suitable condensation polymerization techniques. Polysulfonamides having pendant sulfonamide groups can be prepared by addition polymerization of vinyl monomers containing a pendant sulfonamide moiety. The polysulfonamide preferably exhibits an inherent viscosity of 0.50 to about 1.50. The above-described polysulfonamides prepared by such techniques are compatible with the amplification chemistry and provide desirable pKa, Tg and film-forming properties. Furthermore, they provide mechanical strength required for layer transfer and proper dissolution rates for aqueous processability.

In a particularly preferred embodiment of this invention, the photoresist composition includes a sensitizer which upon exposure to activating radiation reduces the Co (III) compound to Co (II). Any sensitizer which is a photoreductant capable of forming a reducing agent for the Co (III) compound upon exposure to activating radiation is useful.

Useful sensitizers include quinones, disulfides, anthrones, and diazonium salts. Quinones are particularly preferred. Quinones which are particularly useful as photoreductants include o- and p-benzoquinones and o- and p-naphthoquinones, phenanthrenequinones and anthraquinones. The quinones can be unsubstituted or incorporate any substituent or combination of substituents that does not interfere with the conversion of the quinone to the corresponding reducing agent. A variety of such substituents are known in the art and include primary, secondary and tertiary alkyl, alkenyl and alkynyl, aryl, alkoxy, aryloxy, alkoxyalkyl, acyloxyalkyl, aryloxyalkyl, acyloxyalkyl, aryloxyalkoxy, alkylcarbonyl, carboxy, primary and secondary amino, aminoalkyl, amidoalkyl, anilino, piperidino, pyrrolidino, morpholino, nitro, halide and other similar substituents, Alkyl, alkenyl and alkynyl substituents, whether present as sole substituents or present in combination with other atoms, preferably contain about 20 or fewer, more preferably 6 or fewer, carbon atoms. Preferred quinone sensitizers include those set forth in my U.S. Pat. No. 4,684,599.

Exemplary preferred quinone sensitizers which have been found to be useful in the practice of this invention include the following:

| S-1 | 2-Benzylethylamino-3-chloro-1,4-naphthoquinone, |
| S-2 | 2-Dibenzylamino-3-chloro-1,4-naphthoquinone, |
| S-3 | 2-Chloro-3-isopropoxy-1,4-naphthoquinone, |
| S-4 | 2-Chloro-3-isopropoxy-1,4-anthraquinone, |
| S-5 | 2-Diethylamino-3-bromo-1,4-anthraquinone, |
| S-6 | 3-(N-ethyl-N-benzyl)amino-1,4-naphthoquinone, and |
| S-7 | 2-Diethylamino-3-chloro-1,4-naphthoquinone. |

Other addenda can be optionally added to the resist, for example, stabilizers, dyes, surfactants, speed enhancers, anti-foggants, development accelerators, image quality enhancers and the like.

While I do not wish to be bound by any particular theory or mechanism, I believe that imagewise exposure to activating radiation initiates reduction of the Co (III) compound initially present. This can be caused by the cobalt (III) compound being directly reduced by shorter wavelength, e.g., electron beam, radiation, or can be caused by the sensitizer being converted to a reducing agent for the cobalt (III) compound. In any event, the cobalt (III) compound then decomposes and the cobalt (II) atoms produced by reduction of the cobalt (III) compound form a chelate with the redox transfer ligand. The cobalt (II) chelate reduces adjacent remaining cobalt (III) compound. This converts the cobalt (II) chelate to a stable cobalt (III) chelate. For reasons not fully understood, the cobalt (III) chelate is effective in insolubilizing the resist in image areas. This was particularly unexpected in view of the ionic nature of the cobalt (III) chelate. The above-noted theory has been confirmed by a mechanistic study which showed that coatings containing each of the components, i.e., the polymeric binder, Co (III) compound, the redox transfer ligand and the sensitizer, separately or together were all essentially soluble in an aqueous alkaline developer. However, a coating containing the Co (III) chelate was found to be insoluble and unwettable when subjected to the same development process.

The above-described resist compositions of this invention can be applied to a suitable support in the form of a coating composition by a wide variety of known techniques, including coating techniques such as spin coating, spray coating, bead coating, curtain coating, doctor blade coating, roller coating and the like, all of which are conventional.

Useful supports include sheets and foils of such metals as aluminum, copper, magnesium, zinc, etc., glass and glass coated with such metals as chromium, chromium alloys, steel, silver, gold, platinum, etc., synthetic polymeric materials such as poly(acrylates), polyesters, and polyamides. For the manufacture of printed circuit boards, copper is particularly useful. Depending upon the support selected, adhesion aids are optionally applied as a sub-coating.

The coating composition includes the above-described resist composition and a suitable solvent. A particularly useful solvent for the resist of this invention is acetone. However, other suitable solvents, such as 2-butanone, tetrahydrofuran, p-dioxane, cyclohexanone, cyclopentanone and other ketones; 2-methoxyethanol, 2-ethoxyethanol and other alcohols can be employed in preparing coating compositions. The coating composition is then dried by conventional techniques, for example, by baking in an oven.

Thereafter, the resist composition of this invention is exposed to activating radiation, such as electron beam radiation, ultraviolet or visible light. The equipment used to expose the resist is conventional. The resist can be contact or projection exposed. As noted, the aforedescribed resist is particularly adapted for direct imaging with a laser exposure source. Suitable laser exposure sources include laser exposure sources in the visible portion of the spectrum such as an argon laser (488/515 nm), a xenon laser (530 nm), the double YAG laser (550 nm), etc. The exposure times vary depending on the particular resist composition selected, the desired results and the equipment used, preferred times being in the range of a millisecond up to 90 seconds. The sensitivity of the compositions of this invention to activating radiation is markedly improved compared to conventional formulations. Excellent results have been achieved at exposures of 1.0–10 mj/cm$^2$.

To produce a print out image, it is necessary to heat the exposed element to develop the latent images into visible images. For example, print-out images of high density have been attained when the element is contacted with a heat block at 120° C. for seconds. Such visible images can facilitate handling and inspection procedures.

After imagewise exposure and heating, the resist composition is contacted with a developer which can selectively remove the resist in an imagewise manner. The developers useful in the practice of this invention to remove portions of the unexposed resist include conventional resist developers, such as aqueous bases, buffered aqueous bases, KMPR-809 developer (available from KTI Chemicals, Inc.) and the like. Particularly preferred developers include silicone buffered phosphate aqueous bases and those described in U.S. Pat. No. 4,141,733 and European Patent No. 23,758, e.g., quaternary alkanol ammonium hydroxides containing a sulfite stabilizer.

Following development, conventional wet or dry etching processes are useful to etch away the support in the areas left unprotected by the development step.

For use as a laser direct imaging photoresist, the resist is preferably coated onto a copper foil. The dried resist preferably has a thickness of from 1 to about 100 $\mu$m, more preferably 5 to 50 $\mu$m. However, other thicknesses outside this range can be useful in other applications. The metallic foil preferably has a thickness of from 12 to about 100 $\mu$m.

In a preferred embodiment of this invention, the above-described photoresist composition is particularly useful in conjunction with an appropriate support as a high speed lithographic printing plate. A preferred support material comprises grained and anodized aluminum, such as described in U.S. Pat. No. 4,647,346. The support can be treated by any of the methods well known in the art, e.g., the support can be contacted with a silicate material and/or with an aqueous solution containing metal ions. A preferred method of treating the support is described in European Patent No. 218,160 and comprises the steps of contacting the support with a silicate, and contacting the silicated support with a metal salt solution. The support can be coated before receipt of the photoresist composition with known subbing layers. A preferred subbing composition comprises benzoic acid and is described in U.S. Pat. No. 4,640,886. Examples 5–7 which follow illustrate the use of the resist composition of the invention in a high speed lithographic printing plate.

EXAMPLES

The following examples further illustrate the invention:

EXAMPLE 1

In 10 g of a 20% solution of polysulfonamide A6 in acetone were dissolved 40 mg of quinone sensitizer S-6, 40 mg of redox transfer ligand RTL-6, 40 mg of cobalt (III) compound C-5, and 2 mg of FC430 surfactant (available from 3M Co.). This dope was coated with a doctor blade on a 35 $\mu$m thick copper foil at 21° C. under red safe light. The coating was dried on the coating block at 60° C. for 5 minutes followed by 20 minutes at 80° C. in a convention oven. The dry coating (18 $\mu$m thick) was given an imagewise exposure to an argon laser at a dose of 1.0 mj/cm$^2$ (Spectra-Physics model 162) and heated for 5 seconds face-up on a 120° C. hot block to give a high density image. The exposed coating was spray developed for 2 minutes using KMPR 809 developer (2:1 dilution at 30° C.) in a Dynamil machine (Western Technology VRP 50) to give excellent relief dyed images. The coating was etched for 30 minutes in a CuCl$_2$/HCl etching batch at 60° C. to produce excellent quality copper images. Resolution of 2.5 $\mu$m lines/spaces was achieved. A comparative experiment using a photoresist product commercially available from the Dynachem Corporation required 10 mj/cm$^2$ of laser exposure to yield much poorer images.

EXAMPLE 2

A coating was prepared as described in Example 1 except that it was coated at twice the thickness on a 100 $\mu$m unsubbed polyester support. The dry coating was transferred onto a copper clad board by means of a laminator operating at 120° C., 10 psi pressure and a rate of 0.5 m/min to give a clean dry film transfer. The polyester support was peeled from the resist layer which was exposed, heated and developed as described in Example 1 to give the final resist images.

EXAMPLE 3

A coating was prepared as described in Example 2 except that the following coating solution was used:
  10 g of 20% acetone solution of A6 polymer
  40 mg of quinone sensitizer S-6
  200 mg of redox transfer ligand RTL-8
  80 mg of cobalt (III) compound C-4 and
  2 mg of FC430 surfactant.
The solution was coated at a thickness of 25 microns on polyester and transferred onto a copper clad board. The laminated board was exposed to an Argon ion laser at a dose of 10 mj/cm$^2$ and was cured face-up on a 120° C. hot block for 5 seconds to produce an intense black image. It was subsequently spray developed using KMPR 809 developer (2:1 dilution, 2 minutes at 30° C.) and etched to give the final dyed resist image of excellent quality.

EXAMPLE 4

A coating was prepared and processed as described in Example 3 except that 2 mg of phthalimide speed enhancer was incorporated into the coating. The resulting coating was found to be capable of 2X speed gain and only required 5 mj/cm$^2$ of laser exposure to produce a comparable dyed resist image.

EXAMPLE 5

The following coating solution was prepared: Solvent: 9.0 g cyclohexanone Binder: 1.0 g A6 (poly(hexamethylene-1-methyl-2,4-benzenedisulfonamide)) Sensitizer: 60 mg NQ-108 (2-chloro-3-isopropoxy-1,4-naphthoquinone RTL: 60 mg Coen TF (tris(ethylenediamine) cobalt (III) trifluoromethanesulfonate) Ligand: 60 mg PAN (1-(2-pyridylazo)2-naphthol).

The coating was made at a total dry coverage of 60 mg/ft2 (0.65 g/m$^2$) on a subbed, anodized, grained aluminum support using a Headway Spin Coater at 1500 rpm and was dried for 10 min. in a 60° C. convection oven. The coating was exposed to a blue filtered 2 kW mercury light source through a neutral density step wedge of 0.15 increments. The exposed plate was heated for 5 sec, radiation-sensitive side up, on a 120° C. hot block to produce a cyan image of yellow background. The latter was readily removed by a commercial aqueous developer (ENCO EP-26 dilution ratio 2:1) to give an ink receptive final image of excellent quality. The photospeed of the plate was determined by comparing with the commercially available, high speed Kodak PLP Polymatic Litho Plate which was exposed to the same light source and developed in accordance with the trade. The result was as follows: PLP Plate relative speed 1. Example 1 relative speed 10.

EXAMPLE 6

Example 5 was repeated except that the cobalt compound was replaced by cobalt (III) hexammine trifluoroacetate. This coating exhibited excellent image quality and provided higher speed than the composition of Example 5.

EXAMPLE 7

Example 5 was repeated except that the ligand PAN was replaced by 4-(2-Pyridylazo resorcinol). This coating was exposed, heated to produce a bright red image on yellow background which was removed by the EP-26 developer (dilution 1:2) to give final images of excellent quality. Example 7 exhibited a greater relative photospeed than the compositions of Examples 5 and 6.

The invention has been described in detail with particular reference to preferred embodiments thereof, but it will be understood that variations and modifications can be effected within the spirit and scope of the invention.

I claim:

1. A negative-working photoresist composition comprising, in admixture,
    (a) a polymeric binder, wherein said binder is a polysulfonamide,
    (b) a Co (III) compound capable of partial reduction to Co (II) upon exposure to activating radiation, and
    (c) a redox transfer ligand capable of reacting with Co (II) to form a Co (II) chelate which reduces adjacent remaining Co (III) compound in the exposed area and forms a Co (III) chelate effective to provide imagewise differential solubility to said composition.

2. The composition of claim 1 wherein said polysulfonamide is selected from the group consisting of:
    poly(hexamethylene-2,4-toluenedisulfonamide):
    poly(ethylene-co-1,4-cyclohexylenedimethylene-2,4-toluenedisulfonamide); and
    poly(4-methanesulfonamidophenyl acrylate).

3. The composition of claim 1 wherein said Co (III) compound is selected from the group consisting of:
    tris(ethylenediamine) cobalt (III) trifluoromethanesulfonate,
    tris(propylenediamine) cobalt (III) trifluoromethanesulfonate,
    tris(propylenediamine) cobalt (III) trifluoroacetate,
    hexamine cobalt (III) trifluoroacetate,
    hexamine cobalt (III) trifluoromethanesulfonate, and
    tris(ethylenediamine) cobalt (III) trifluoroacetate.

4. The composition of claim 1 wherein said redox transfer ligand is selected from the group consisting of: nitroso-arols, dithiooxamides, formazans, aromatic azo compounds, hydrazones, Schiff bases, and phthalaldehyde adducts.

5. The composition of claim 1 wherein said redox transfer ligand is selected from the group consisting of:
    2,2'-Bipyridine,
    1-Nitroso-2-naphthol,
    2-Nitroso-1-naphthol,
    2-(2-Thiazolylazo)-p-cresol,
    1-(2-Pyridyl)-3-phenyl-5-(p-chlorophenyl)formazan,
    1-(2-Pyridylazo)-2-naphthol,
    1-(2-benzothiazolylazo)-2-naphthol, and
    1-hydroxy-3-trichloroacetamidophthalan.

6. A negative-working photoresist composition comprising, in admixture,
    (a) a polymeric binder, wherein said binder is a polysulfonamide,
    (b) a sensitizer,
    (c) a Co (III) compound capable of partial reduction to Co (II) upon exposure to activating radiation in the presence of said sensitizer, and
    (d) a redox transfer ligand, capable of reacting with Co (II) to form a Co (II) chelate which reduces adjacent remaining Co (III) compound in the exposed area and forms a Co (III) chelate effective to provide imagewise differential solubility to said composition.

7. The composition of claim 6 wherein said sensitizer is a quinone.

8. The composition of claim 6 wherein said sensitizer is selected from the group consisting of:
    2-Benzylethylamino-3-chloro-1,4-naphthoquinone,
    2-Dibenzylamino-3-chloro-1,4-naphthoquinone,
    2-Chloro-3-isopropoxy-1,4-naphthoquinone,
    2-Chloro-3-isopropoxy-1,4-anthraquinone,
    2-Diethylamino-3-chloro-1,4-naphthoquinone,
    2-Diethylamino-3-bromo-1,4-anthraquinone, and
    3-(N-ethyl-N-benzyl)amino-1,4-naphthoquinone.

9. A photoresist element comprising a support and a layer of the composition defined in claim 1.

10. The element of claim 9 wherein said support is a copper foil.

11. A method of producing a negative-working image in a photoresist comprising the steps of imagewise exposing to activating radiation the composition defined in claim 1, heating and developing said exposed composition with a developer so that only the exposed portions remain.

12. The method of claim 11 wherein said composition is imagewise exposed to a laser exposure source.

13. The element of claim 9 wherein said support comprises anodized aluminum.

* * * * *